(12) United States Patent
Abedifard et al.

(10) Patent No.: US 7,120,054 B2
(45) Date of Patent: *Oct. 10, 2006

(54) PRECONDITIONING GLOBAL BITLINES

(75) Inventors: Ebrahim Abedifard, Sunnyvale, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 160 days.

This patent is subject to a terminal disclaimer.

(21) Appl. No.: 11/062,661

(22) Filed: Feb. 22, 2005

(65) Prior Publication Data

US 2005/0141282 A1   Jun. 30, 2005

Related U.S. Application Data

(63) Continuation of application No. 10/227,734, filed on Aug. 26, 2002, now Pat. No. 6,859,392.

(51) Int. Cl.
*G11C 11/34* (2006.01)

(52) U.S. Cl. .......................... 365/185.13; 365/185.33; 365/204

(58) Field of Classification Search ............ 365/185.13, 365/185.33, 204, 185.29, 185.26, 203
See application file for complete search history.

(56) References Cited

U.S. PATENT DOCUMENTS

| 4,905,197 | A | | 2/1990 | Urai | |
| 5,521,866 | A | * | 5/1996 | Akaogi | 365/185.29 |
| 5,736,891 | A | | 4/1998 | Buti et al. | |
| 5,862,079 | A | | 1/1999 | Jinbo | |
| 5,923,603 | A | | 7/1999 | Pinney | |
| 6,011,720 | A | * | 1/2000 | Tanaka | 365/185.22 |
| 6,094,391 | A | | 7/2000 | Pinney | |
| 6,157,569 | A | * | 12/2000 | Nomura et al. | 365/185.11 |
| 6,327,202 | B1 | | 12/2001 | Roohparvar | |
| 6,404,685 | B1 | | 6/2002 | Pinney | |
| 6,411,555 | B1 | | 6/2002 | Tran | |
| 6,421,288 | B1 | | 7/2002 | Pinney | |
| 6,490,212 | B1 | | 12/2002 | Nguyen | |
| 6,525,969 | B1 | | 2/2003 | Kurihara | |
| 6,538,943 | B1 | | 3/2003 | Rogenmoser | |

* cited by examiner

*Primary Examiner*—David Lam
(74) *Attorney, Agent, or Firm*—Leffert Jay & Polglaze, P.A.

(57) ABSTRACT

A method and apparatus for discharging global bitlines in a flash memory to a voltage sufficiently low to avoid drain disturb for non-selected cells in a programming operation. A discharge device allows discharge of global bitlines coupled to local bitlines before a programming operation.

18 Claims, 3 Drawing Sheets

PRECONDITIONING GLOBAL BITLINES

RELATED APPLICATION

This application is a continuation of U.S. patent application Ser. No. 10/227,734, filed Aug. 26, 2002, now U.S. Pat. No. 6,859,392 and titled, "Preconditioning Global Bitlines," which is commonly assigned and incorporated by reference in its entirety herein.

FIELD

The present invention relates generally to memory devices and in particular the present invention relates to preconditioning in memory devices.

BACKGROUND

Memory devices are available in a variety of styles and sizes. Some memory devices are volatile in nature and cannot retain data without an active power supply. A typical volatile memory is a DRAM which includes memory cells formed as capacitors. A charge, or lack of charge, on the capacitors indicate a binary state of data stored in the memory cell. Dynamic memory devices require more effort to retain data than non-volatile memories, but are typically faster to read and write.

Non-volatile memory devices are also available in different configurations. For example, floating gate memory devices are non-volatile memories that use floating gate transistors to store data. The data is written to the memory cells by changing a threshold voltage of the transistor and is retained when the power is removed. The transistors can be erased to restore the threshold voltage of the transistor. The memory may be arranged in erase blocks where all of the memory cells in an erase block are erased at one time. These non-volatile memory devices are commonly referred to as flash memories.

Floating gate memory cells include a source region and a drain region that is laterally spaced apart from the source region to form an intermediate channel region. The source and drain regions are formed in a common horizontal plane of a silicon substrate. A floating gate, typically made of doped polysilicon, is disposed over the channel region and is electrically isolated from the other cell elements by oxide. For example, gate oxide can be formed between the floating gate and the channel region. A control gate is located over the floating gate and can also made of doped polysilicon. The control gate is electrically separated from the floating gate by another dielectric layer. Thus, the floating gate is "floating" in dielectric so that it is insulated from both the channel and the control gate.

As cell sizes in memories continue to decrease, and the number of cells associated with memories continues to increase, a larger number of cells are accessed using the same bitline. When a bit is to be read, a high voltage is placed on the bit's word line (control gate) and bitline (drain), and the cell can be read through sensing processes known in the art. Because the channel length of cells is getting shorter, the amount of voltage on the drain side of the channel that is required to start electron injection is also getting smaller. Because the energy of the cells is so high, and the channel length is so short, the electric field on the cells is bigger than it used to be. The electrons injected into the cell by a potential at the drain are hotter and hotter because the channel lengths are getting shorter.

When a cell is being read, then, a voltage at the drain of the cell may actually in some cases begin to soft program the cell. Even if the cell does not fully program due to this effect, fully erased cells become less fully erased, and if enough read cycles pass, the cells may actually begin to read as programmed cells. Even if the cells do not become too programmed to actually read as programmed cells, their margins of erase drop, so that the cells are slower to erase.

Further, because of the architecture of flash memories, and in particular synchronous flash memories, when the memory is moving into a programming cycle from a read cycle, global bitlines are precharged to $V_{cc}$ or a similar voltage. When all the global bitlines are precharged, and then the word line is turned on for a programming cycle, when the local bitline connection is made to the global bitline, the local bitline sees a voltage of near $V_{cc}$. This is sufficient in certain instances to begin to program the particular memory cell by a drain disturb. Cells to be programmed on the local bitline will be overwritten during the programming operation, so there is not a problem with disturbing those cells. However, cells on the bitline that are not being programmed still see the same high voltage when they are coupled to a global bitline precharged to at or near $V_{cc}$. Therefore, the unselected cells, that is those cells that are not to be programmed, see a high voltage on their gates, and a drain voltage of near $V_{cc}$. With those voltage levels at the gate and source, there is a potential for disturbing the cells.

For the reasons stated above, and for other reasons stated below which will become apparent to those skilled in the art upon reading and understanding the present specification, there is a need in the art for reducing the drain stress on non-selected cells in a flash memory program operation.

SUMMARY

The above-mentioned problems with drain disturb and soft programming in flash memories and other problems are addressed by the present invention and will be understood by reading and studying the following specification.

In one embodiment, a method for preconditioning global bitlines in a flash memory includes discharging all global bitlines of the memory to a predetermined voltage prior to a programming process.

In another embodiment, a method of preconditioning a global bitline of a memory cell includes coupling the global bitline to a local bitline of the cell, and turning on a discharge transistor connected between the local bitline and a predetermined voltage.

In yet another embodiment, a method of preconditioning a global bitline in a flash memory includes coupling the global bitline to a predetermined voltage prior to a programming process.

In still another embodiment, a method for programming flash memory cells in a flash memory includes preconditioning global bitlines of the memory, discharging the global bitlines to a predetermined potential, and programming selected cells.

In another embodiment, a preconditioning circuit for a flash memory cell includes a global bitline coupleable to a local bitline of the memory cell, a pass transistor through which the global bitline is coupleable to the local bitline, and a discharge transistor connected between the pass transistor and the local bitline.

In still another embodiment, a flash memory device includes an array of floating gate memory cells, control circuitry to read, write and erase the floating gate memory cells, and a preconditioning circuit to precondition global bitlines prior to a programming operation.

Other embodiments are described and claimed.

DETAILED DESCRIPTION

Figure 1A:
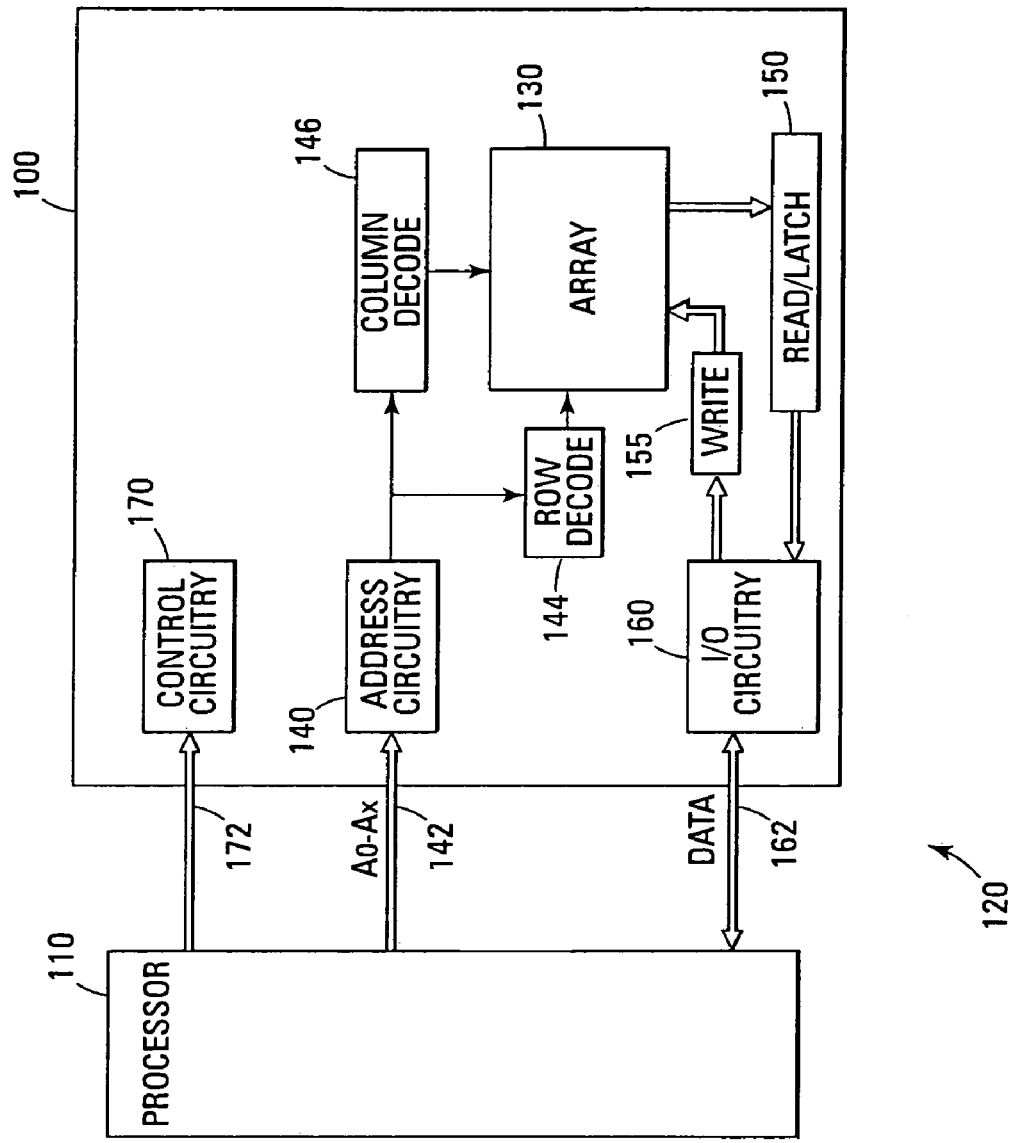
FIG. 1A is a block diagram of a memory device according to one embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

FIG. 1A is a functional block diagram of a memory device 100, of one embodiment of the present invention, which is coupled to a processor 110. The memory device 100 and the processor 110 may form part of an electronic system 120. The memory device 100 has been simplified to focus on features of the memory that are helpful in understanding the present invention. The memory device includes an array of memory cells 130. The memory array 130 is arranged in banks of rows and columns.

An address buffer circuit 140 is provided to latch address signals provided on address input connections A0-Ax 142. Address signals are received and decoded by row decoder 144 and a column decoder 146 to access the memory array 130. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 130 by sensing voltage or current changes in the memory array columns using sense/latch circuitry 150. The sense/latch circuitry, in one embodiment, is coupled to read and latch a row of data from the memory array. Data input and output buffer circuitry 160 is included for bi-directional data communication over a plurality of data (DQ) connections 162 with the processor 110. Data is written to array 130 through write circuitry 155.

Command control circuit 170 decodes signals provided on control connections 172 from the processor 110. These signals are used to control the operations on the memory array 130, including data read, data write, and erase operations. The flash memory device has been simplified to facilitate a basic understanding of the features of the memory. A more detailed understanding of internal circuitry and functions of flash memories are known to those skilled in the art.

Figure 1B:
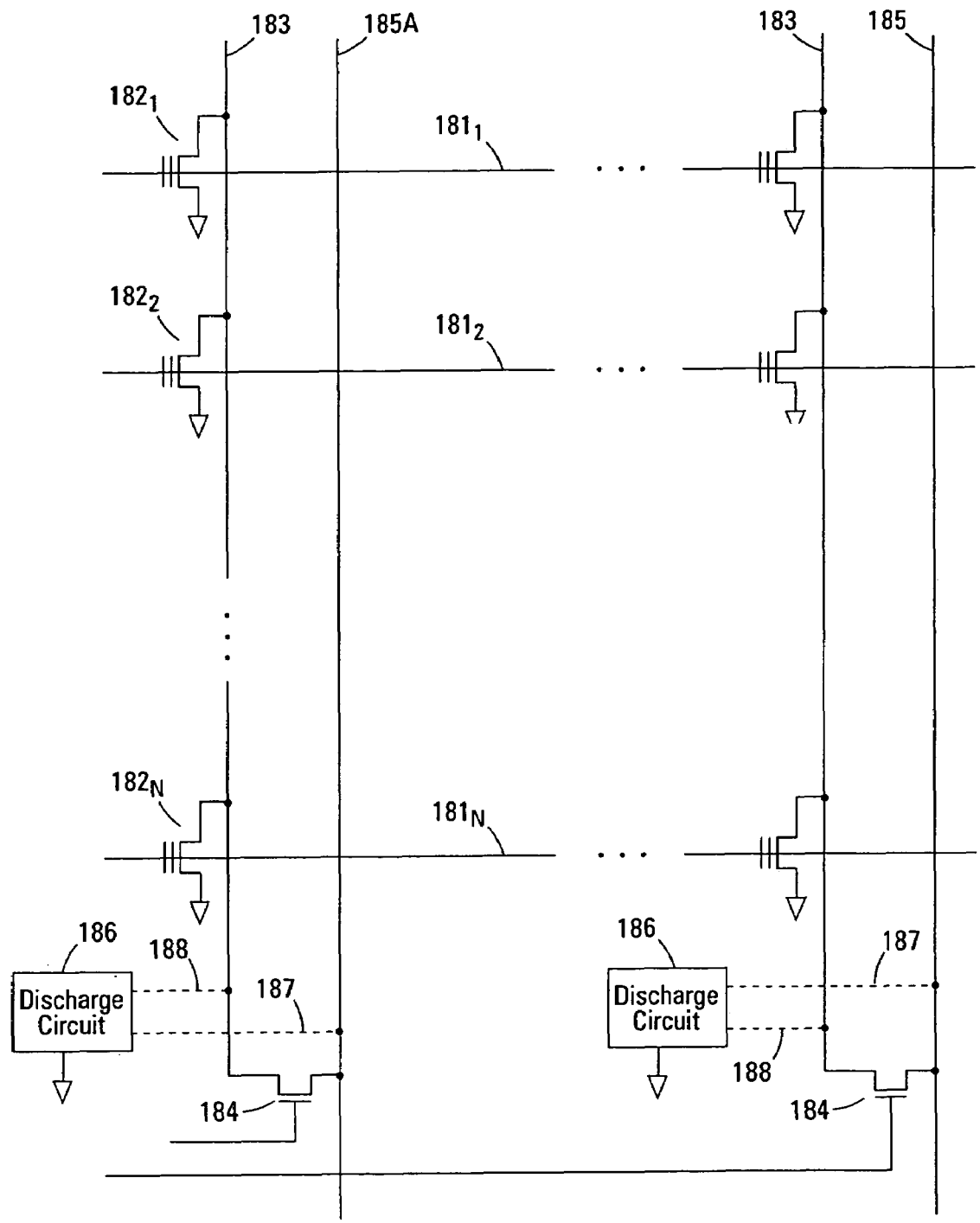
FIG. 1B is a circuit diagram of a portion of a memory array according to one embodiment of the present invention.

The memory array can be arranged in a plurality of addressable banks. Each bank of the memory array can be divided into numerous blocks of non-volatile memory cells. Each block of cells can be erased during a common erase operation. The memory cells in the blocks are arranged in rows and columns, similar to a DRAM. FIG. 1B shows a circuit diagram 180 of a portion of a memory according to another embodiment of the present invention. In this embodiment, rows are defined by word lines $181_{1\ldots N}$, each word line coupled to a control gate of a non-volatile memory cell such as $182_{1\ldots N}$ and $182_{1\ldots N}$ respectively. Each cell 182 on a local bitline has its own word line connection. Local bit lines 183 are coupled to the drain of each memory cell in a column of memory cells such as cells $182_{1\ldots N}$, and define the columns of the memory array 180. Pass transistors, or gates, 184 are coupled between a local bit line 183 and a global bit lines for each column of the array 180. That is, local bit lines 183 of the numerous banks can be selectively coupled to a global bit line 185 via the pass transistors 184. Two global bit lines are coupled to a common differential sense amplifier.

It can be seen from FIG. 1B that when a word line such as word line $181_1$ is selected to program a memory cell $182_1$, while the cell is commonly connected to other cells long the same bitline, for example cells $182_2$, which is not to be programmed, the non-selected cells such as cell $182_2$ along the same bitline are connected to a global bitline such as bitline 185A which has been precharged as discussed below. With a high voltage on the drain through the global bitline connection to the local bitlines, a potential programming can occur on non-selected cell $182_2$. Discharge circuitry 186 as described below is in various embodiments coupled either to local bitlines such as bitline 183 via connection 187, or to global bitlines such as global bitline 185A via connection 188.

In preparation for a program cycle in flash memories of the architecture shown, the global bitlines are precharged, typically to a supply voltage $V_{cc}$. Once the global bitlines are precharged, the coupling of global bitlines to local bitlines charges the local bitlines toward $V_{cc}$. For local bitlines of cells that are not to be programmed, but which are on the local bitline, this potential, in combination with a high potential at the gate of the cell, creates the possibility of a drain disturb.

The embodiments of the present invention are directed to the discharge of the precondition voltage placed on the global bitlines for a read cycle before a programming cycle of a flash memory.

Figure 2:
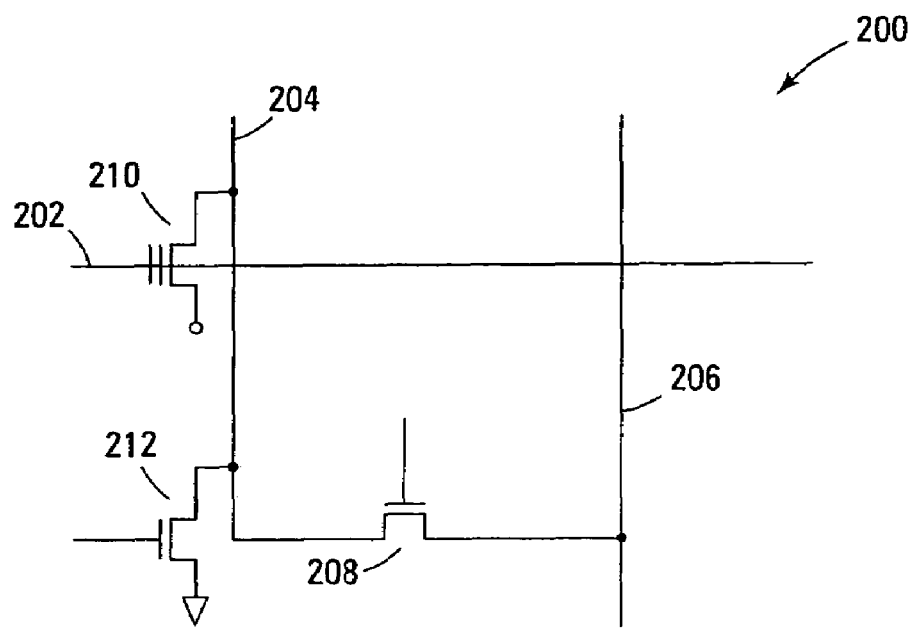
FIG. 2 is a block diagram of a portion of a memory array according to another embodiment of the present invention.

In one embodiment, discharging of the global bitlines is accomplished through coupling the global bitlines to the local bitlines, and turning on a discharge circuit such as discharge transistor coupled to ground before turning on the word line. FIG. 2 is a view of a memory cell 200 having a word line 202, a local bitline 204 coupled to a global bitline 206 by a block pass transistor 208, a flash memory transistor 210, and a discharge transistor 212 coupled between the drain of the flash memory transistor 210 and the block pass transistor 208. When the discharge transistor 212 is turned on, and the global bitline is coupled to the local bitline when the block pass transistor 208 is on, the global bitline 206 is discharged to ground through the discharge transistor 212. Once the global bitline is discharged to ground, it poses no potential drain disturb problem for non-selected memory cells for a subsequent programming operation for the memory.

A preconditioning circuit according to one embodiment of the present invention includes the global bitlines, the block pass transistors, and the discharge transistors connected between the drains of individual memory cells and the block pass transistors. In a program operation using the flash memory of this embodiment, when a program process is initiated, the global bitlines of the memory array are discharged as follows. The global bitlines are precharged as in a synchronous flash memory, as described above. The global bitlines are connected to the local bitlines through the block pass transistors, and the discharge transistors are turned on to discharge the global bitlines to ground. Following that, the word lines are turned on and programming continues as in a normal flash memory. However, the global bitlines of non-selected cells, having been discharged to ground, or in another embodiment to a bitline disturb threshold voltage sufficient to create a source to drain voltage of less than about 1 volt, do not have any drain disturb effect on the non-selected cells. The cells that are to be programmed have their bitlines brought to the programming voltage, and the word lines are turned on to effect programming.

Figure 3:
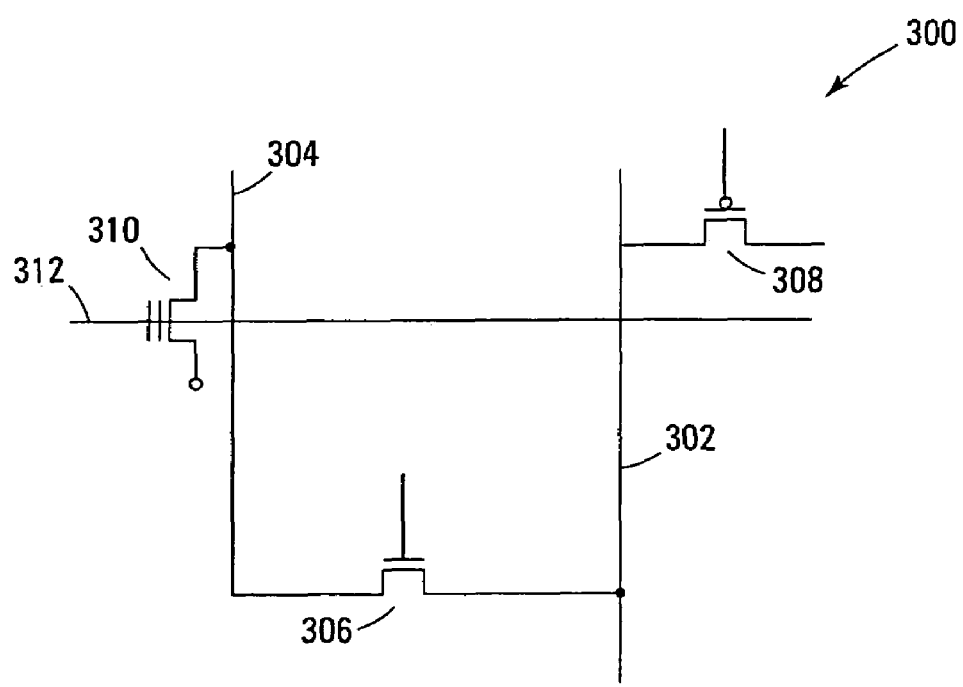
FIG. 3 is a block diagram of a portion of a memory array according to another embodiment of the present invention.

In another embodiment 300 shown in FIG. 3, the global bitlines 302 are discharged before the coupling of the global bitlines 302 to the local bitlines 304 through pass transistors 306. Discharging in this embodiment is accomplished by coupling the global bitlines 302 to a discharge circuit such as a bitline disturb threshold switch 308 or the like to reduce the supply voltage to the global bitlines 302. In one embodiment, there are switches 308 coupled to the global bitlines 302 for precharging. These switches 308 provide in one embodiment a half current of a normal charging current for the global bitlines 302. Reducing the supply allows a discharge of the global bitlines 302 down to a potential below the bitline disturb threshold voltage. In one embodiment, the switches 308 are p-channel transistors, so the global bitlines 302 are discharged to a threshold voltage of the p-channel transistor 308, for example approximately 0.6 volts, which allows the global bitlines to be pulled to a potential of about 0.6 volts above the baseline level of the global bitlines, for example ground or a substrate voltage in various embodiments. Following discharge of the switches 308 for the global bitlines 302, programming of cells 310 using local bitlines 304 and word lines 312 is accomplished as is known in the art.

In operation, as a memory comes out of a read cycle, all of the bitlines are precharged. At this point, a program cycle is ready to start. The program cycle in this embodiment comprises discharging the global bitlines to zero before the typical steps of a program cycle begin. Following discharge of the global bitlines to a reasonable level, in one embodiment zero, but in other embodiments to a sufficient level that reduces the drain to source voltage for non-selected cells to below about 1 volt, then the global bitlines are coupled to the local bitlines.

Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

CONCLUSION

A method and circuit for preconditioning global bitlines in a flash memory has been described that includes a discharge transistor between the drain of a memory cell and its connection to the global bitline. The global bitline is discharged to ground or an appropriate level before a program operation, to avoid drain disturb of non-selected cells during programming.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system, comprising:
    a processor; and
    a flash memory device coupled to the processor, the flash memory device comprising:
        a plurality of floating gate memory cells arranged in a pattern of rows and columns;
        a plurality of word lines, each word line connected to multiple cells in a row of cells;
        a plurality of local bitlines, each bitline connected to multiple cells in a column of cells;
        a plurality of global bitlines, each global bitline connectable to a local bitline through a pass transistor; and
        a discharge circuit to discharge each global bitline to a predetermined potential.

2. The system of claim 1, wherein the discharge circuit comprises:
    a transistor connected between a drain of each memory cell and the predetermined potential.

3. The system of claim 1, wherein the discharge circuit comprises:
    a switch connected to each global bitline, to discharge each global bitline to a threshold voltage of the switch.

4. A system, comprising:
    a processor; and
    a flash memory device coupled to the processor, the flash memory device comprising:
    an array of floating gate memory cells;
    control circuitry to read, write and erase the floating gate memory cells; and
    a preconditioning circuit to precondition global bitlines prior to a programming operation.

5. The system of claim 4, wherein the preconditioning circuit comprises:
    a global bitline coupleable to a local bitline of each memory cell;
    a pass transistor through which the global bitline is coupleable to the local bitline; and
    a discharge transistor connected between the pass transistor and the local bitline.

6. A processing system, comprising:
    a processor; and
    a flash memory device coupled to the processor, the flash memory device comprising an array of flash memory cells each comprising:
        a floating gate storage transistor, the transistor having a gate, a drain, and a source; and
        a preconditioning circuit to precondition global bitlines prior to a programming operation.

7. The system of claim 6, wherein the preconditioning circuit comprises:
   a global bitline coupleable to a local bitline of each memory cell;
   a pass transistor through which the global bitline is coupleable to the local bitline; and
   a discharge device connected between the pass transistor and the local bitline.

8. The system of claim 7, wherein the discharge device is a transistor.

9. The system of claim 7, wherein the transistor is connected between a drain of its respective memory cell and the predetermined potential.

10. The system of claim 7, wherein the discharge device is a switch.

11. A processing system, comprising:
   a processor; and
   a flash memory device coupled to the processor, the flash memory device comprising an array of flash memory cells each comprising:
   a floating gate storage transistor, the transistor having a gate, a drain, and a source; and
   a discharge device connected between the drain and a predetermined potential, wherein the discharge device is a switch connected to its respective global bitline, to discharge its global bitline to a threshold voltage of the switch.

12. A memory device comprising:
   an array of memory cells;
   control circuitry to read, write and erase the memory cells;
   address circuitry to latch address signals provided on address input connections;
   input/output circuitry coupled to read and latch a row of data from the memory array; and
   a preconditioning circuit to precondition global bitlines prior to a programming operation.

13. The system of claim 12, wherein the preconditioning circuit comprises:
   a global bitline coupleable to a local bitline of each memory cell;
   a pass transistor through which the global bitline is coupleable to the local bitline; and
   a discharge transistor connected between the pass transistor and the local bitline.

14. A processing system, comprising:
   a processor; and
   a memory coupled to the processor to store data provided by the processor and to provide data to the processor, the memory comprising:
   an array of memory cells;
   control circuitry to read, write and erase the memory cells;
   address circuitry to latch address signals provided on address input connections;
   input/output circuitry coupled to read and latch a row of data from the memory array; and
   a preconditioning circuit to precondition global bitlines prior to a programming operation.

15. The system of claim 14, wherein the preconditioning circuit comprises:
   a global bitline coupleable to a local bitline of each memory cell;
   a pass transistor through which the global bitline is coupleable to the local bitline; and
   a discharge transistor connected between the pass transistor and the local bitline.

16. A memory, comprising:
   an array of flash memory cells, each cell comprising:
   a floating gate storage transistor, the transistor having a gate, a drain, and a source; and
   a discharge device connected between the drain and a predetermined potential; and
   a preconditioning circuit for each flash memory cell, comprising:
   a global bitline coupleable to a local bitline of the memory cell;
   a pass transistor through which the global bitline is coupleable to the local bitline; and
   a discharge circuit connected between the pass transistor and the local bitline.

17. The memory of claim 16, wherein the discharge circuit comprises:
   a transistor connected between a drain of each memory cell and the predetermined potential.

18. The flash memory array of claim 16, wherein the discharge circuit comprises:
   a switch connected to each global bitline, to discharge each global bitline to a threshold voltage of the switch.

* * * * *